United States Patent
Divakaruni et al.

(10) Patent No.: US 6,184,107 B1
(45) Date of Patent: Feb. 6, 2001

(54) CAPACITOR TRENCH-TOP DIELECTRIC FOR SELF-ALIGNED DEVICE ISOLATION

(75) Inventors: Rama Divakaruni, Middletown; Ulrike Gruening; Byeong Y. Kim, both of Wappingers Falls; Jack A. Mandelman, Stormville, all of NY (US); Larry Nesbit, Farmington, CT (US); Carl J. Radens, LaGrangeville, NY (US)

(73) Assignees: International Business Machines Corp., Armonk, NY (US); Siemens Microelectronics, Cupertino, CA (US)

( * ) Notice: Under 35 U.S.C. 154(b), the term of this patent shall be extended for 0 days.

(21) Appl. No.: 09/271,124

(22) Filed: Mar. 17, 1999

(51) Int. Cl.[7] .................................................. H01L 21/76
(52) U.S. Cl. .................. 438/427; 438/430; 438/243; 438/244
(58) Field of Search .................................. 438/424, 427, 438/430, 243, 244

(56) References Cited

U.S. PATENT DOCUMENTS

| 5,831,301 | * | 6/2000 | Horak et al. | 257/302 |
| 5,945,707 | * | 8/1999 | Bronner et al. | 257/330 |
| 6,074,909 | * | 6/2000 | Gruening | 438/242 |

* cited by examiner

Primary Examiner—Trung Dang
(74) Attorney, Agent, or Firm—Pollock, Vande Sande & Amernick, R.L.L.P.

(57) ABSTRACT

A semiconductor device including a substrate. At least one pair of deep trenches is arranged in the substrate. A collar lines at least a portion of a wall of each deep trench. A deep trench fill fills each deep trench. A buried strap extends completely across each deep trench over each deep trench fill and each collar. An isolation region is arranged between the deep trenches. A dielectric region overlies each buried strap in each deep trench.

7 Claims, 3 Drawing Sheets

US 6,184,107 B1

CAPACITOR TRENCH-TOP DIELECTRIC FOR SELF-ALIGNED DEVICE ISOLATION

RELATED APPLICATIONS

This application is related to U.S. patent application Ser. No. 09/233,887, for Improved Process For Buried Strap Self-Aligned To Deep Storage Trench, filed Jan. 20, 1999, the entire contents of the disclosure of which is hereby incorporated by reference.

FIELD OF THE INVENTION

The invention relates to semiconductor devices. In particular, the present invention relates to dynamic random access memory (DRAM) devices.

BACKGROUND OF THE INVENTION

Increasing numbers of semiconductor devices, such as individual memory cells, are being created on a single chip. As a result, dimensions of the devices continue to shrink. Shrinking device dimensions can increase the difficulty of ensuring proper alignment over an adequate functional area of the structures included in the semiconductor devices.

For example, a merged isolation node trench (MINT) cell is illustrated in FIG. 1. The MINT cell illustrated in FIG. 1 includes a planar transfer device. The device shown in FIG. 1 includes a deep trench capacitor 1 a shallow trench isolation region 2 used to define the active area, a bit line contact (CB) 3, a word line (WL) 5, or transfer device gate, gate oxide 7 and N+ source/drain regions 9 and 11. In the structure illustrated in FIG. 1, a buried strap 12 connects the deep trench capacitor storage trench node 1 to the source/drain diffusion 11 of the transfer device. In a MINT cell, MINT buried strap resistance may be a function of the overlap of the deep trench 1 and the shallow trench isolation region 2 of the memory cell.

SUMMARY OF THE INVENTION

The invention addresses MINT buried strap resistance as a function of overlay between the deep trench and active area overlay making the shallow trench isolation pattern self-aligned to the deep trench to ensure full trench width for buried strap formation.

In accordance with these and other objects and advantages, the present invention provides a semiconductor device including a substrate. At least one pair of deep trenches is arranged in the substrate. A collar lines at least a portion of a wall of each deep trench. The trenches contain a conductive fill material. A buried strap extends completely across each trench over each trench fill and each collar. An isolation region is arranged between the deep trenches. A dielectric region overlies each buried strap in each deep trench.

Aspects of the present invention also provide a process for forming an active area and shallow trench isolation self-aligned to a deep trench. The process includes forming at least one pair of adjacent deep trenches in a substrate and through a first dielectric layer on a surface of the substrate. A dielectric collar is provided on at least a portion of a side wall of each deep trench. The deep trenches are filled. A top surface of the deep trench fill is recessed. A portion of the deep trench collars is etched. A strap material is deposited on the deep trench fill and within the recessed deep trench collars. A second dielectric layer is deposited on exposed surfaces of the strap material, the substrate, and the first dielectric layer. The structure is planarized, thereby removing portions of the second dielectric layer, such that the second dielectric layer only remains in the deep trenches. A layer of photoresist is deposited. The photoresist is patterned to expose portions of the second dielectric layer in the deep trenches and portions of the first dielectric layer such that at least a portion of the photoresist remains overlapping the deep trench. Portions of the first dielectric layer between the trenches are selectively removed. A portion of the second dielectric layer in the trenches and a portion of the substrate between the trenches are selectively removed. A third dielectric layer is deposited in spaces created by removal of the portions of the first dielectric layer and portions of the second dielectric layer. The third dielectric layer is then planarized. Remaining portions of the first dielectric layer are removed.

Further aspects of the present invention provide a semiconductor device formed by the above process.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

As semiconductor device dimensions decrease and an increasing number of devices are packed into one space, problems may arise as a result of device crowding and aligning devices and portions of devices with ever decreasing dimensions. For example, in some memory cells, the deep trench and active area pattern may be misaligned. One problem resulting from this is that buried strap resistance is a function of deep trench-active area overlay. Therefore, misalignment of the deep trench-active area overlay may alter buried strap resistance, and cause an increase in the variation of the series resistance of the buried strap due to the manufacturing tolerance of the misalignment.

Figure 1:
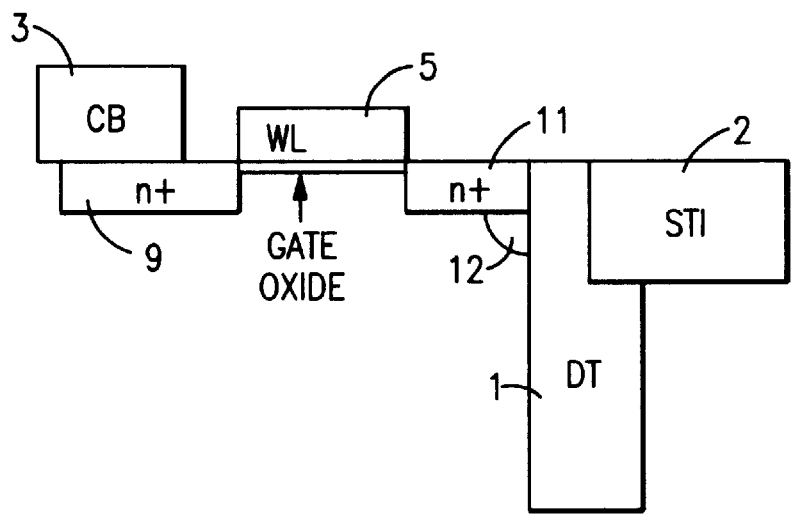
FIG. 1 represents a cross-sectional view of an example of a known DRAM cell structure.
Figure 2:
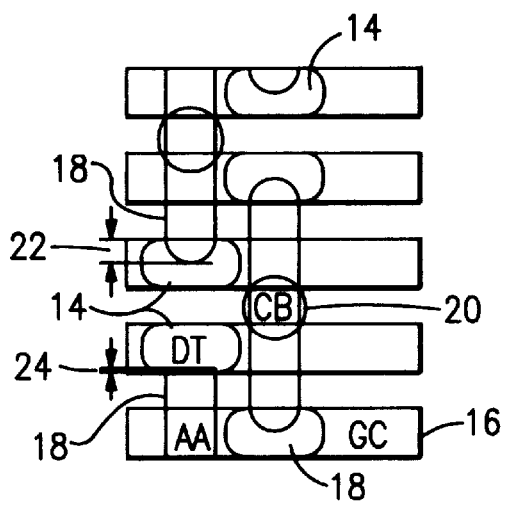
FIG. 2 represents an overhead view of an embodiment of a DRAM cell structure illustrating examples of more desirable and less desirable overlaps of deep trenches and active areas.

FIG. 2 illustrates an overhead view of a portion of a semiconductor device structure showing a plurality of deep trenches and illustrating deep trench-active area overlay. FIG. 2 illustrates deep trenches 14, gate conductors 16, active areas 18 and diffusion contact (CB) regions 20. FIG. 2 also illustrates two examples of deep trench-active area overlay. Deep trench-active area overlay area 22 illustrates a more favorable amount of overlay between the active area and the deep trench. On the other hand, deep trench-active area region 24 is less desirable.

Figure 3:
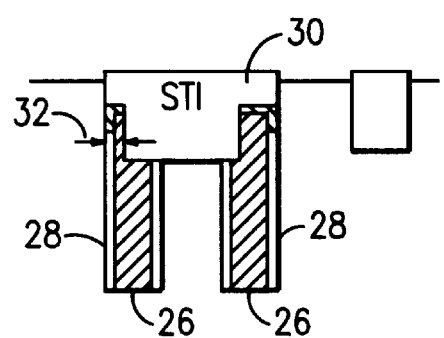
FIG. 3 represents a cross-sectional view of a less desirable deep trench to active area overlay.
Figure 4:
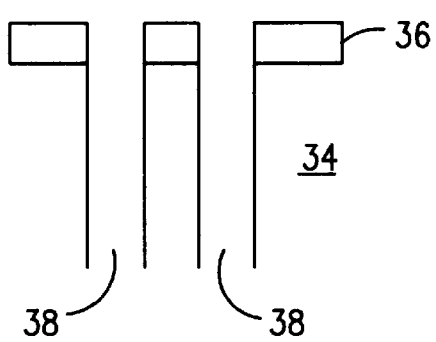
FIGS. 4–15 represent cross-sectional views of an embodiment of a semiconductor device structure according to the present invention at various stages of an embodiment of a process according to the present invention.
Figure 5:
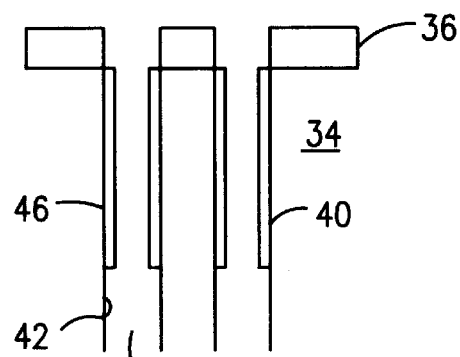

FIG. 3 illustrates a cross-sectional view of an example of less favorable deep trench-active area overlay 32. FIG. 3 illustrates filled deep trenches 26 each having an associated collar region 28. Shallow trench isolation region 30 overlies deep trenches 26 as well as a region between the deep trenches.

The present invention provides a solution for ensuring favorable deep trench-active area overlay by providing a process for making the active area pattern self-aligned to the deep trench to ensure the full trench width for buried strap formation. Processes according to the present invention would be utilized to form a MINT-based deep trench capacitor and shallow trench isolation region using a trench top oxide region as a masking layer for the shallow trench isolation region. Processes according to the present invention may also be utilized for forming other semiconductor devices.

According to the structure of the present invention illustrated in FIGS. 4–15, a substrate 34 may be provided. A dielectric layer 36 may be provided on the top surface of the substrate. According to one example, the dielectric layer is a nitride. In particular, nitride that may be utilized as the dielectric layer 36 is silicon nitride SiN. Although not shown in the figures, additional thin dielectric layers, such as silicon dioxide, may be included in the dielectric layer 36. After providing a substrate 34 with dielectric layer 36 arranged on the top surface thereof, deep trenches 38 may be formed through dielectric layer 36 into substrate 34 using standard lithographic and dry etch techniques, such as reactive ion etching (RIE).

After formation of deep trenches 38, a collar 40 may be formed on a portion of the surface 42 of each deep trench 38. The collar may be formed of a dielectric material, such as silicon dioxide.

The collar may be formed by oxidation of the trench wall. Typically, the collar is formed in an upper region of each deep trench 38 such that the collar, when formed, extends all of the way to the top of the deep trenches 38. In other words, the substrate material forming the walls 42 of deep trenches 38 may be oxidized to form the collar 40.

Figure 6:
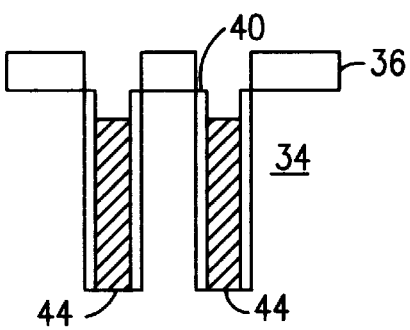

After formation of the collar regions 40, the deep trenches are filled with a conductive material. FIG. 6 illustrates an example of filled deep trenches. The deep trenches may first be filled with a desired material. Examples of materials that may be utilized to fill the deep trenches include various semiconductor materials. For example, polycrystalline silicon may be utilized as a deep trench fill.

After filling the deep trenches, the upper surface of the structure illustrated in FIG. 6 may be planarized to remove any deep trench fill that may have been deposited the upper surface of the structure. The deep trench fill may then be recessed below the opening of the deep trench at the upper level of the substrate. The recessing may be carried out utilizing a dry etch technique, such as RIE. In other words, the deep trench fill may be recessed below the interface of substrate 34 and dielectric layer 36. FIG. 6 illustrates recessed deep trench fill 44.

Figure 7:
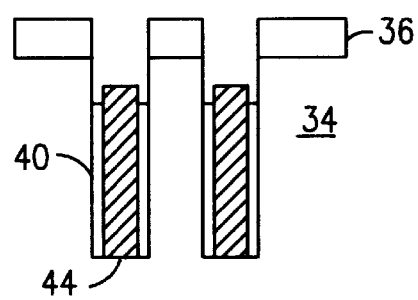

After filling the deep trenches and recessing the trench fill to a desired level, the collars 40 may be isotropically etched away from the exposed sidewalls of the trenches such that the top surface of the collars is below the top surface of the trench fill. Etching of the collars 40 may be carried out with a wet etch process. FIG. 7 illustrates recessed collar structures 40.

After recessing the collar structures 40, a buried strap may be formed in each deep trench. According to the present invention, the deep strap may be formed so as to extend entirely across the deep trenches. The buried straps may be formed of a semiconductor material. According to one embodiment, the buried straps may be formed of silicon.

Any suitable technique may be utilized for forming the buried strap. For example, chemical vapor deposition may be utilized. According to one embodiment, low pressure chemical vapor deposition (LP CVD) may be utilized to form the buried strap.

Figure 8:
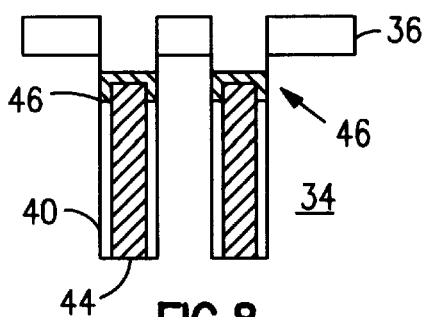

The buried strap may be formed so as to cover the trench fill 44 as well as the collar structures 40. In one embodiment of the invention, after depositing the buried strap material, the material may be recessed. FIG. 8 illustrates an example of buried straps 46 formed over the trench fill 44 and recessed collar 40 after the strap silicon has been isotropically removed from the wafer surface and trench sidewalls.

After formation of the buried strap structures 46, a liner 48 may be formed over dielectric layer 36, surfaces of the dielectric layer 36 lining the opening above the deep trenches, the walls of the deep trenches above the strap 46, and the surface of the straps although this is not shown in the Figures. It is not necessary that the present invention include a liner. Rather, the liner is an optional structure. The liner may be formed of a dielectric material. According to one example, the liner is formed of an LPCVD nitride having a thickness of about 2 nm to about 10 nm. One particular nitride that may be utilized in the liner is silicon nitride SiN. In addition, it may be desired to form a thin thermal oxidation of about 2 nm to about 10 nm prior to deposition of the liner.

After formation of the liner structure 48, a dielectric material 50 may be deposited over the liner. If the present invention does not include a liner, then the dielectric layer would be deposited over the same structures described above that the liner would be deposited on. Any suitable dielectric may be utilized. According to one example, an oxide may be utilized to form dielectric layer 50. One example of an oxide that may be utilized is silicon dioxide.

Figure 9:
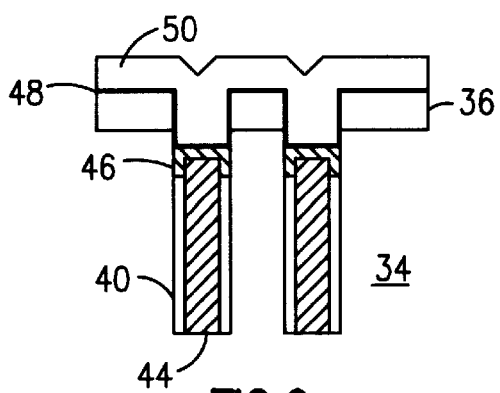

FIG. 9 illustrates a structure including the liner 48 and dielectric region 50.

Figure 10:
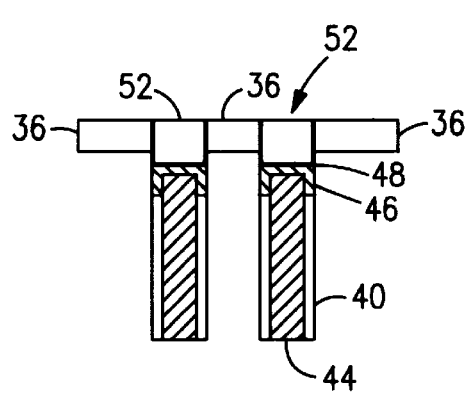

After deposition of dielectric layer 50, portions of dielectric 50 lying above dielectric region 36 may be removed by planarizing, such as by chemical mechanical polishing (CMP), the dielectric region 50. During this planarization step, regions of the liner lying on top of the dielectric region 36 may also be removed, if the structure includes a liner. FIG. 10 illustrates the structure resulting from planarization of the dielectric region 50. As can be seen in FIG. 10, the remaining portions of dielectric region 50 lie within the deep trench and within the opening in the dielectric region 36 lying above the deep trenches. These dielectric regions 52 may form a trench top region at the top of each deep trench. In the event that dielectric material 50 was an oxide, regions 52 may be referred to as a trench top oxide (TTO).

Figure 11:
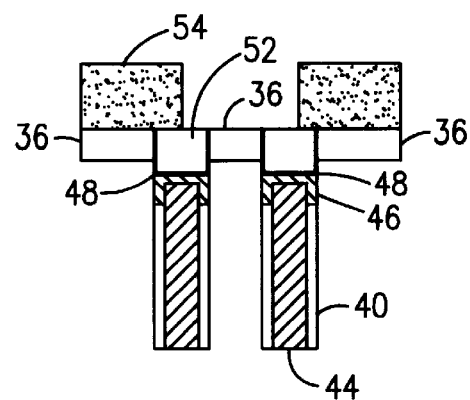

After removing portions of the dielectric region 50 to create trench top regions 52, photoresist 54 may be deposited over the entire upper surface of the structure. After depositing the photoresist, the photoresist may be patterned to form an active area and shallow trench isolation pattern on the structure. FIG. 11 illustrates an example of pattern photoresist 54 on a structure. The photoresist illustrated in FIG. 11 has been patterned to expose a portion of each trench top region 52 as well as a region of dielectric 36 between the deep trenches. Traditional photolithography processes may be utilized to pattern the photoresist to form the mask.

After formation of desired mask pattern 54 over the deep trench and other underlying structures, the regions of the structure exposed by removal of portions of the photoresist may be etched. Typically, a reactive ion etch is utilized. The etch may includes fluorine, carbon and oxygen feed gas. Examples of such gasses can include $CF_4$, $CHF_3$, Ar, $O_2$, CO, $C_2F_6$, $C_4F_6$, and/or $C_3F_8$.

Figure 12:
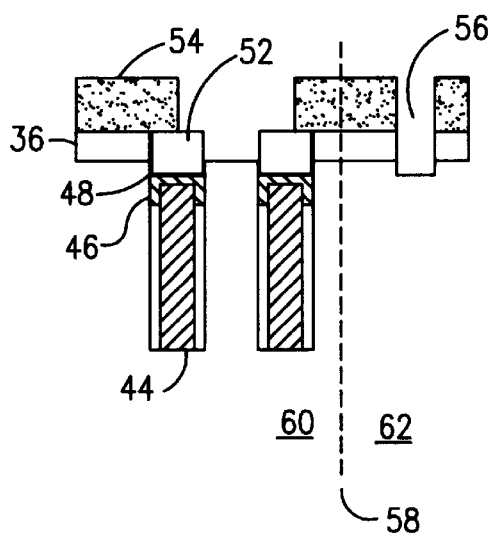

The etch process may be carried out in a plurality of steps. For example, a first etch may be utilized to etch only the portions of dielectric region 36 but not portions of dielectric 52. Such an etch may be considered to etch the dielectric 36 selective to dielectric 52. At least a portion of the substrate underlying regions of dielectric layer 36 may be removed by the etch. This etch may also be considered to be selective to the photoresist. FIG. 12 illustrates a region 56 adjacent the deep trenches created by the etch.

The resulting structures may now be considered to represent to portions of a semiconductor device divided by line 58. These portions are the array 60 and the supporting structure 62. The region 56 created by the etch represents a part of the supporting structures. The support structures may include conventional transistors and shallow trench isolation regions.

Figure 13:
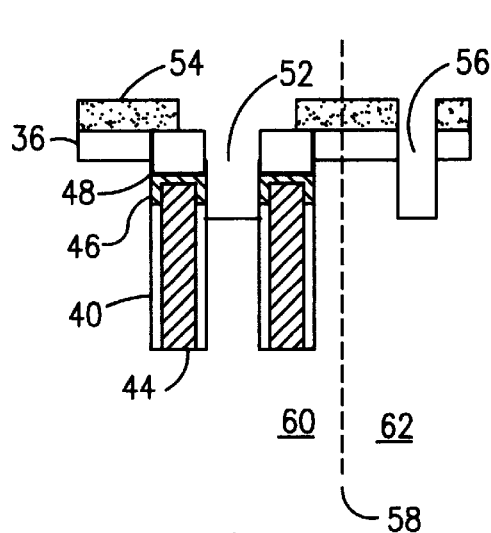

A second etch may now carried out to etch the silicon substrate. This second etch will be selective to the exposed portions of the trench top structures 52. As illustrated in FIG. 13, the substrate may be etched down to a level that lies below the strap structure 46 and below the top of the collar regions 40. The region between the deep trenches as well as the support structure opening 56 may be etched to the same level. Alternatively, these two regions may be etched to differential levels. As illustrated in FIG. 13, during the etching of the substrate, at least a portion of the trench top regions 52 may also be etched. This second etch may be considered to be an etch of the silicon selective to the dielectric 52 as well as photoresist 54 and can be dry etch using feed gases, such as $Cl_2$, HCl, HBr, and/or BCl.

After etching of the dielectric region 36, substrate, and trench top regions 52, remaining photoresist 54 may be removed from the upper surface of the structure. Also after etching the dielectric 36, substrate and trench top regions, material may be deposited in region 64. Region 64 may form an isolation region, typically a shallow isolation region, between the deep trenches. Material filling isolation region 64 may also be utilized to fill support structure trench 56. The regions 56 and 64 may be filled simultaneously.

The material deposited in region 64 may be a dielectric material. According to one example, the dielectric material deposited in region 64 is an oxide, such as silicon oxide. The dielectric material forms a shallow trench isolation region. After depositing the dielectric to form region 64, the upper surface of the structure may be planarized to remove regions of dielectric material lying outside of the space forming the isolation region. The planarization may be carried out using CMP.

Figure 14:
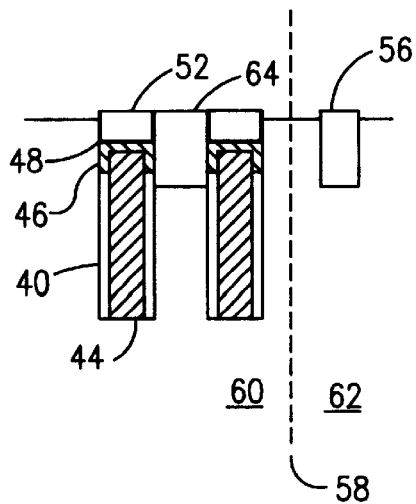

After filling isolation region 64, dielectric region 36 may be removed from the upper surface of the substrate. Planarization of dielectric material filling the isolation region 64 may also remove portions of the trench too regions 52 as well as dielectric region 36. This planarization step may be useful to result in co-planar top surfaces of the trench top regions 52 and isolation regions 64. The planarization step may also help to make the top of the support structure 56 co-planar with the trench top regions 52 and isolation region 64. FIG. 14 illustrates an embodiment of the device structure at this stage in the process.

After formation of the structure shown in FIG. 14, transistor and other devices may then be formed over at least one of the deep trenches and over the support structure. The device structures formed over the structure illustrated in FIG. 15 may include gate conductor regions. Middle of line regions including contacts to diffusion regions and to the gate conductor and the first level of interconnect wiring, typically known as metal 0 (M0) may also be formed over the deep trenches and/or supporting structure using standard processing techniques.

According to one particular embodiment, the present invention also provides a process for forming an active area in shallow trench isolation self-aligned to a deep trench. The process includes providing a substrate having a layer of nitride on the surface. At least one pair of adjacent deep trenches is formed through the nitride and in the substrate.

An oxide collar is provided on at least a portion of a sidewall of each trench. The trenches are filled with polycrystalline silicon. A top surface of the trench fill is recessed. A portion of the trench collars is etched. An oxide strap material is deposited on the trench fill and over the recessed trench collars. A liner may be deposited on exposed surfaces of the strap material, the substrate, and the nitride layer on the substrate. An oxide layer is deposited on the liner or on the structures that the liner is deposited on if the invention does not include a liner. The entire structure is planarized to remove portions of the oxide layer on the liner and portions of the liner, such that the oxide layer only remains in the trenches. If the structure does not include a liner, then only portions of the oxide layer would be removed.

Photoresist is deposited over the structure. The photoresist is patterned to expose portions of the oxide layer in the trenches and the nitride layer on the substrate such that at least a portion of the photoresist remains overlapping the deep trench. Portions of the nitride layer on the substrate between the trenches are selectively removed. A portion of the oxide layer in the trenches and a portion of the substrate between the trenches are selectively removed. An oxide is deposited in spaces created by removal of the nitride layer on a substrate between the trenches and in the portions of the oxide layer in the trenches. The oxide is then planarized. Nitride remaining on the surface of the substrate is removed. Transistor devices are formed over at least one of the deep trenches.

The present invention also includes a semiconductor device formed by a process as described above. A semiconductor device according to the present invention may be formed according to the above described processes. Alternatively, other processes may be utilized to form a semiconductor device according to the present invention.

A semiconductor device according to the present invention includes a substrate. At least one pair of deep trenches is arranged in the substrate. The deep trenches may be parallel or substantially parallel as described above. A trench fill may be arranged in each deep trench. An isolation region may be arranged between the trenches.

The present invention may include a plurality of pairs of deep trenches. Each pair being as described above. A buried plate structure may be arranged in each substrate in association with each pair of deep trenches.

A collar region lines at least a portion of a wall of each deep trench. The collar may be arranged in each deep trench in the vicinity of an upper portion of each deep trench. The collar may be formed of a dielectric material. The dielectric material may be an oxide. One example of an dielectric material that may be utilized is silicon dioxide $SiO_2$.

A buried strap extending completely across each deep trench over each deep trench fill and each collar. A dielectric region may overlay each buried strap in each deep trench. A liner may be arranged between each strap and each dielectric region.

Transistor devices and interconnection structures may be formed above at least one of the deep trenches.

A support structure may be formed in the substrate remote from deep trenches. The support structure isolation trenches may be filled with a dielectric material. The dielectric material may be an oxide. One example of an oxide that may be utilized is silicon dioxide $SiO_2$.

Figure 15:
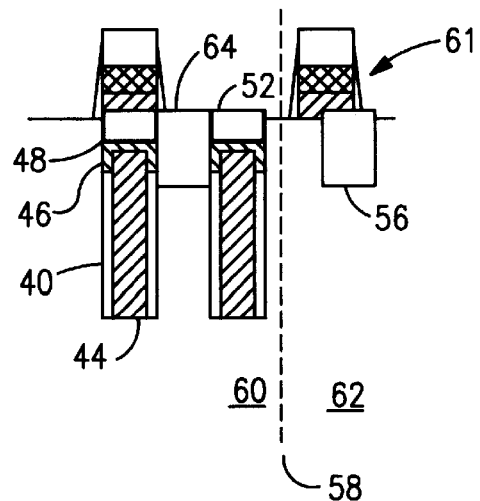

The array region is shown as region 60, and the support structures are shown as region 61 in FIG. 15. The materials comprising each region of a semiconductor device according to the present invention may be as described above in relation to a process of the present invention.

Among the advantages of the present invention are that it is not necessary to rely on critical alignment of the AA pattern level to the deep trench pattern level. As long as part of the AA pattern overlaps the deep trench, this may provide a strap. Additionally, according to the present invention, the deep trench may be made smaller in diameter because the critical overlap tolerance between the AA level and deep trench level is increased.

According to the present invention, a greater amount of misalignment can be tolerated than according to prior methods and structures because the active area photoresist pattern need only cover the edge of the trench top structure over the deep trench in order to ensure that there is a good conduction path from the active area through the strap and into the deep trench storage capacitor. According to the present invention, unlike the embodiment illustrated in FIGS. 2 and 3, the shallow trench isolation may only lie between back-to-back trenches and as such will not cut into strap width as in DRAM cells, such as those illustrated in FIGS. 2 and 3. Furthermore, the present invention may also help to eliminate the active area-deep trench overlay sensitivity of the buried strap resistance by merging the active area and deep trench patterns.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A process for forming an active area and shallow trench isolation self-aligned to a deep trench, the process comprising:

forming at least one pair of adjacent deep trenches in a substrate and through a first dielectric layer on a surface of the substrate;

providing a dielectric collar on at least a portion of a sidewall of each deep trench;

filling the deep trenches;

recessing a top surface of the trench fill;

etching a portion of the trench collars;

depositing a strap material on the trench fill and within the recessed trench collars;

depositing a second dielectric layer on exposed surfaces of the strap material, the substrate, and the first dielectric layer;

planarizing the structure thereby removing portions of the second dielectric layer, such that the second dielectric layer only remains in the deep trenches;

depositing a layer of photoresist;

patterning the photoresist to expose portions of the second dielectric layer in the deep trenches and portions the first dielectric layer such that at least a portion of the photoresist remains overlapping the deep trench;

selectively removing portions of the first dielectric layer between the trenches;

selectively removing a portion of the substrate between the trenches;

depositing and planarizing a third dielectric layer in spaces created by removal of portions of the first dielectric layer and portions of the second dielectric layer; and removing remaining portions of the first dielectric layer.

2. The process according to claim 1, further comprising the step of:

forming a buried plate in the substrate in association with the pair of deep trenches.

3. The process according to claim 1, further comprising the step of:

forming transistor devices over at least one of the deep trenches.

4. The process according to claim 1, wherein a wet etch process is utilized to etch the top surface of the collars.

5. The process according to claim 1, wherein a low pressure chemical vapor deposition is utilized to form the collars.

6. The process according to claim 1, further comprising:

depositing a liner on exposed surfaces of the strap material, the substrate, and the first dielectric layer, wherein the second dielectric layer is deposited on the liner and portions of the liner and the second dielectric layer are removed during the planarization.

7. A process for forming an active area and shallow trench isolation self-aligned to a deep trench, the process comprising:

providing a substrate having a layer of nitride on a surface;

forming at least one pair of adjacent deep trenches through the nitride and the substrate;

providing an oxide collar on at least a portion of a sidewall of each trench;

filling the trenches;

recessing a top surface of the trench fill;

etching a portion of the trench collars;

depositing a strap material on the trench fill and over the recessed trench collars;

depositing an oxide layer on exposed surfaces of the strap material, the substrate, and nitride layer on the substrate;

planarizing the structure to remove portions cf the oxide layer, such that the oxide layer only remains in the trenches;

depositing photoresist over the structure;

patterning the photoresist to expose portions of the oxide layer in the trenches and the nitride layer on the substrate such that at least a portion of the photoresist remains overlapping the deep trench;

selectively removing portions of the nitride layer on the substrate between the trenches;

selectively removing a portion of the substrate between the trenches;

depositing and planarizing oxide in spaces created by removal of the nitride layer on the substrate between the trenches and in the portions of the oxide layer in the trenches;

removing nitride remaining on the surface of the substrate; and forming transistor devices over one of the deep trenches.

* * * * *

UNITED STATES PATENT AND TRADEMARK OFFICE
CERTIFICATE OF CORRECTION

PATENT NO.    : 6,184,107 B1
DATED         : February 6, 2001
INVENTOR(S)   : Ramachandra Divakaruni et al.

It is certified that error appears in the above-identified patent and that said Letters Patent is hereby corrected as shown below:

Column 3,
Line 57, after "deposited" insert -- on --.

Column 5,
Line 30, after "now" insert -- be --.

Signed and Sealed this

Fifth Day of March, 2002

Attest:

Attesting Officer

JAMES E. ROGAN
Director of the United States Patent and Trademark Office